United States Patent
Yang et al.

(10) Patent No.: US 7,646,826 B2
(45) Date of Patent: Jan. 12, 2010

(54) TYPE DEPENDENCY MODULATION METHOD WITH TYPE CONTROL

(75) Inventors: Yung-Chi Yang, Hsinchu (TW); Che-Kuo Hsu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 599 days.

(21) Appl. No.: 10/933,301

(22) Filed: Sep. 3, 2004

(65) Prior Publication Data

US 2005/0141635 A1     Jun. 30, 2005

(30) Foreign Application Priority Data

Dec. 31, 2003    (TW) .............................. 92137813 A

(51) Int. Cl.
*H04K 1/02*     (2006.01)
*H04L 25/49*    (2006.01)

(52) U.S. Cl. ................. 375/296; 375/253; 375/285; 375/302

(58) Field of Classification Search .......... 375/295, 375/296, 278, 271, 260, 243, 245, 248, 239, 375/284, 246, 253, 276, 285; 341/58, 59
See application file for complete search history.

(56) References Cited

U.S. PATENT DOCUMENTS

| | | | | |
|---|---|---|---|---|
| 5,917,857 A * | 6/1999 | Tanaka et al. | ................ | 375/253 |
| 6,288,657 B1 * | 9/2001 | Ino | ............. | 341/102 |
| 6,359,930 B1 * | 3/2002 | Nakagawa et al. | .......... | 375/253 |
| 6,879,637 B1 * | 4/2005 | Nakagawa et al. | .......... | 375/253 |
| 7,200,175 B2 * | 4/2007 | Nakagawa et al. | .......... | 375/253 |
| 2002/0167426 A1 * | 11/2002 | Hayami | ...................... | 341/59 |
| 2003/0142757 A1 * | 7/2003 | Kahlman et al. | ............ | 375/295 |
| 2004/0184555 A1 * | 9/2004 | Kayanuma | .................. | 375/295 |
| 2005/0053160 A1 * | 3/2005 | Immink et al. | | |
| 2005/0129133 A1 * | 6/2005 | Liu | .............. | 375/246 |

\* cited by examiner

*Primary Examiner*—Chieh M Fan
*Assistant Examiner*—Qutbuddin Ghulamali
(74) *Attorney, Agent, or Firm*—Birch, Stewart, Kolasch & Birch, LLP

(57) ABSTRACT

A type dependency modulation method with type control is integrated with type control code words in traditional type dependency modulation. It increases the effect of DC component control in the overall encoding procedure. In this method, a specific type-control code word is inserted at certain intervals in the encoding procedure, increasing the selectable code words in subsequent encoding procedures, thereby improving the DC component control ability.

13 Claims, 11 Drawing Sheets

TYPE DEPENDENCY MODULATION METHOD WITH TYPE CONTROL

This Non-provisional application claims priority under 35 U.S.C. § 119(a) on Patent Application No(s). 092137813 filed in Taiwan, Republic of China on Dec. 31, 2003, the entire contents of which are hereby incorporated by reference.

BACKGROUND OF THE INVENTION

1. Field of Invention

The present invention relates to a modulation method for generating modulation signals and, in particular, to a type dependency modulation method that utilizes type-control code words to increase the DC component control ability.

2. Related Art

The common modulation method used in recording media refers to the method that generates code word sequence from data words to be stored in recording media by using specific modulation rules. This cause that data words could to be recording more efficiently for recording media, and be reproduced from code words which recording in recording media using the corresponding demodulation method.

Normally under the Run-length limited (RLL) modulation method, there is a (d, k)-constraint. In the so-called (d, k)-constraint, d refers to the minimal number of logic 0's between two consecutive logic 1's; and k refers to the maximal number of logic 0's between two consecutive logic 1's. Taking the eight-to-fourteen modulation (EFM) modulation method as an example, it can use the 8/14 modulation table to perform the encoding procedure to encode the data words under the (d, k)=(2, 10) constraint. However, in order for any two code words to be connected and satisfy the (d, k)-constraint and to effectively increase the DC component control ability, a merging code of 3-bit long is further inserted into an originally 14-bit code word. Therefore the coding rate becomes 8/17. This does not only greatly decrease the coding rate, but also increasing the complication of encoding algorithm. Another EFMPlus modulation method mainly combines the type and state to provide a modulation method with an 8/16 coding rate under the (d, k)=(2, 10) constraint. However, many code words are used twice in this method. That is, different data words may be encoded into the same code word. Therefore, additional encoding rules are required to avoid errors during decoding procedure.

After the above-mentioned modulation methods, there are some another type dependency modulation methods that combine the type and set concepts are developed. For high coding rate reason, there is relatively fewer code words can be used. So the traditional dependency modulation methods always make a modulation table with repeated code words according to the type dependency rule between two consecutive code words. Although this method can largely increase the overall coding rate, the selectable code words in the encoding procedure are even fewer, resulting in the decrease of the DC component control ability. For most of modulation designs, increasing the length of look-ahead path can actually boost the DC component control ability. However, this has only limited effects and makes the algorithm a lot more complicated than before.

Therefore, how to increase the number of selectable code words in existing type dependency modulation methods in order to increase the DC component control ability is an important subject in the field.

SUMMARY OF THE INVENTION

In view of the foregoing, the present invention develops a type dependency modulation method with type control. It uses the concept of type-control in the conventional type dependency modulation methods that only integrate code word type and code word set. Eventually, it achieves the goal of increase the DC component control ability after modulation.

Its primary technical feature is the following. When the type dependency modulation method runs and reaches a certain interval (i.e. after a certain length of data words encoding procedure), a type-control code word is added in the code word sequence. By changing the type, this renders more code words to be selected when encodes the next data word. Besides, the added type-control code words have to satisfy the (d, k) and type constraints by the type dependency modulation method.

To achieve the above-mentioned objective, the disclosed method includes the steps of: (a) executing a encoding procedure to find the code word corresponding to a data word; (b) accumulating a counter value after completing the encoding procedure of each data word; (c) executing an insertion encoding procedure of a type-control code word when the counter value reaches a predetermined interval; (d) resetting the counter value to zero after inserting the type-control code word; and repeating steps (a) to (d) until all data words are encoded.

Using the disclosed method, there are more selectable code words during the encoding procedure of conventional type dependency modulation methods. This also achieves the DC component control ability in the encoding procedure.

BRIEF DESCRIPTION OF THE DRAWINGS

The present invention will become more fully understood from the detailed description given hereinbelow illustration only, and thus are not limitative of the present invention, and wherein:

FIG. 2 is a preferred embodiment of the type-control code word set according to the present invention; and FIGS. 3 to 11 show a preferred embodiment of modulation table according to the present invention.

DETAILED DESCRIPTION OF THE INVENTION

Figure 1:
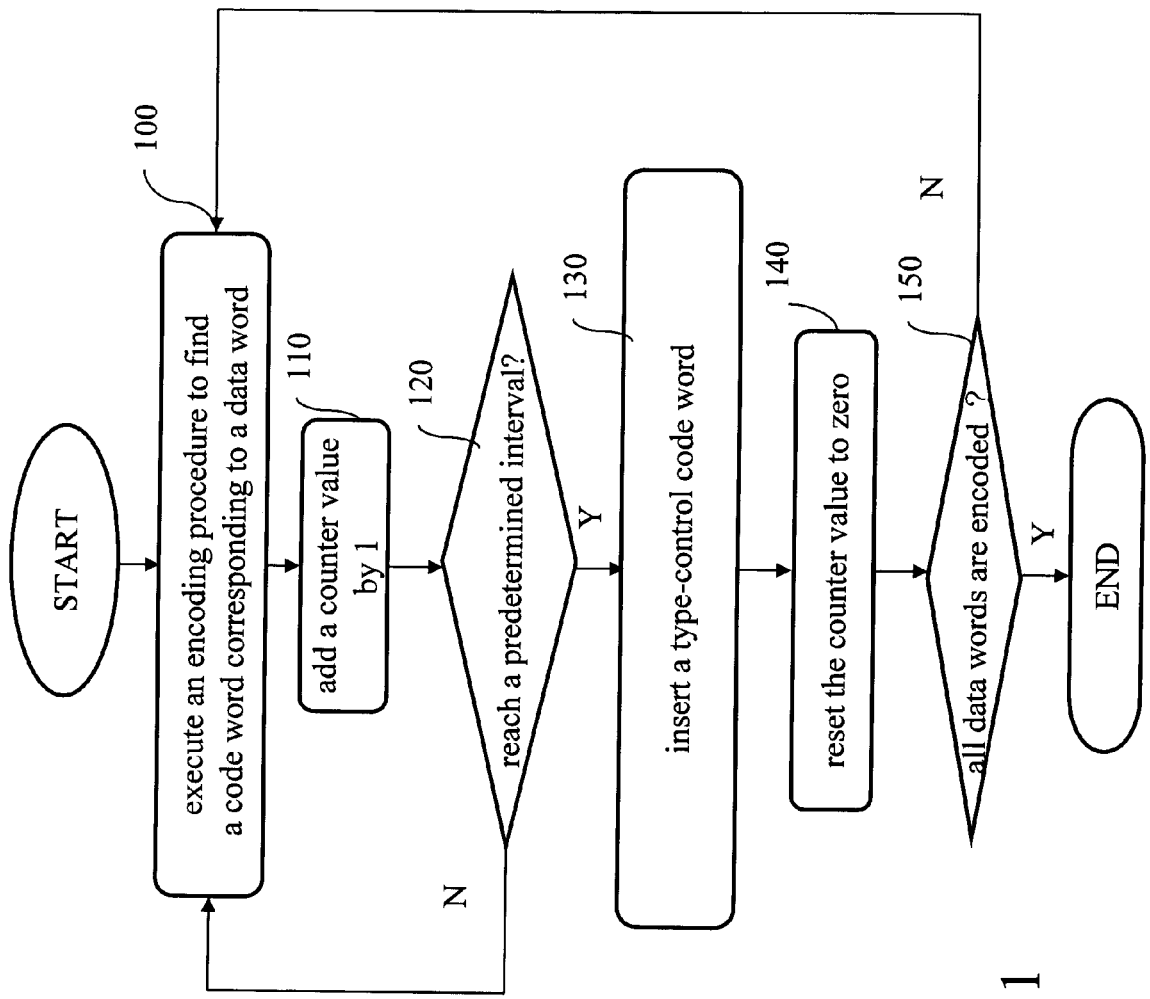
FIG. 1 is a flowchart of the disclosed type dependency modulation method with type control.

The present invention provides a type dependency modulation method with type control can increase the amount of selectable code words by increasing the type-control code words in the encoding procedure, thereby increasing the DC component control ability.

The so-called type dependency modulation method uses the concepts of code word type and code word set to design its modulation table. So that the procedure of converting data words into code words must satisfy (d, k) and type constraints. However, this type dependency method reduces the selectable code words because of the type constraints in the encoding procedure. This renders a worse DC component control ability.

The invention uses the idea of inserting type-control code words into encoded code word sequence to increase the selection of valid code words. It solves the problem of insufficient DC component control ability in conventional type dependency modulation methods for the reason of high coding rate design.

Figure 3:
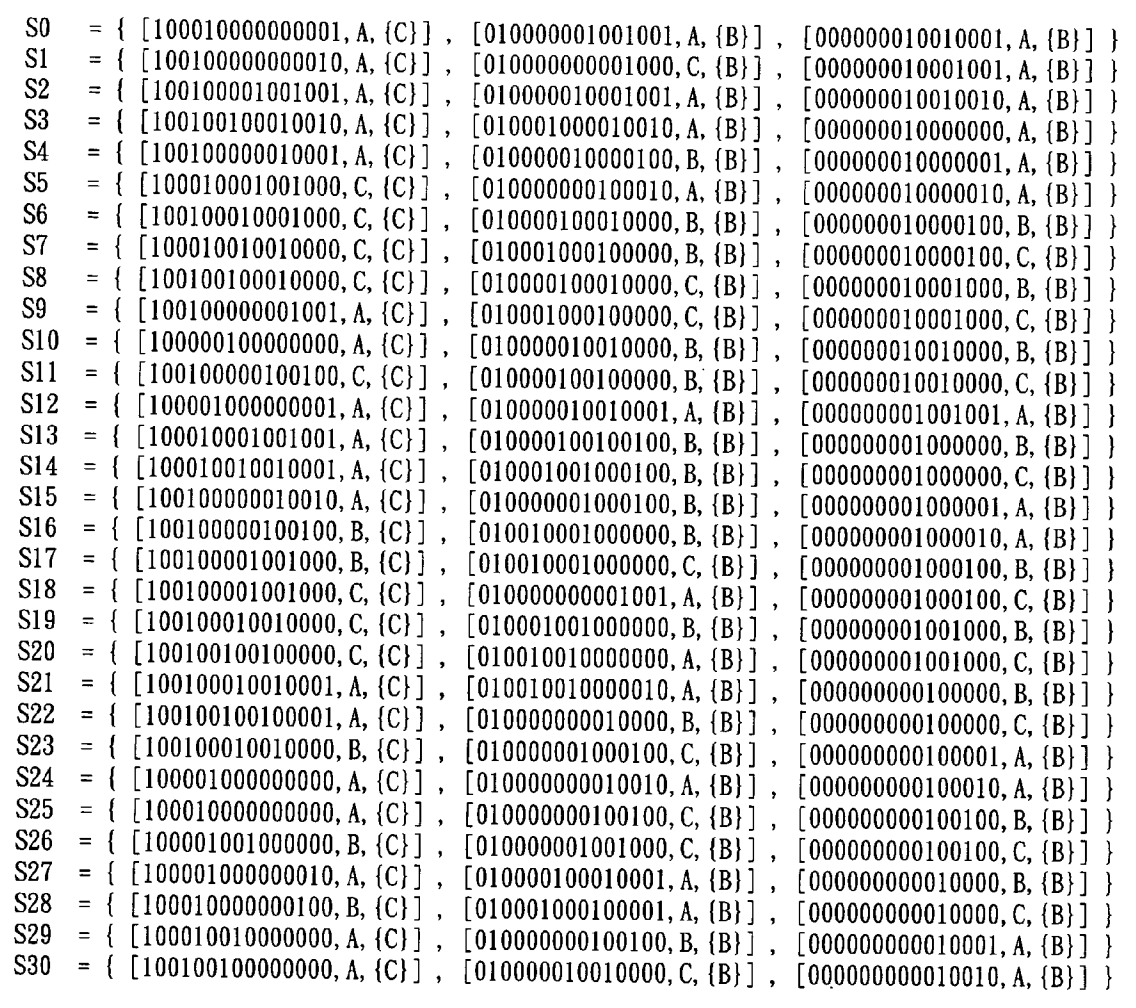
Figure 4:
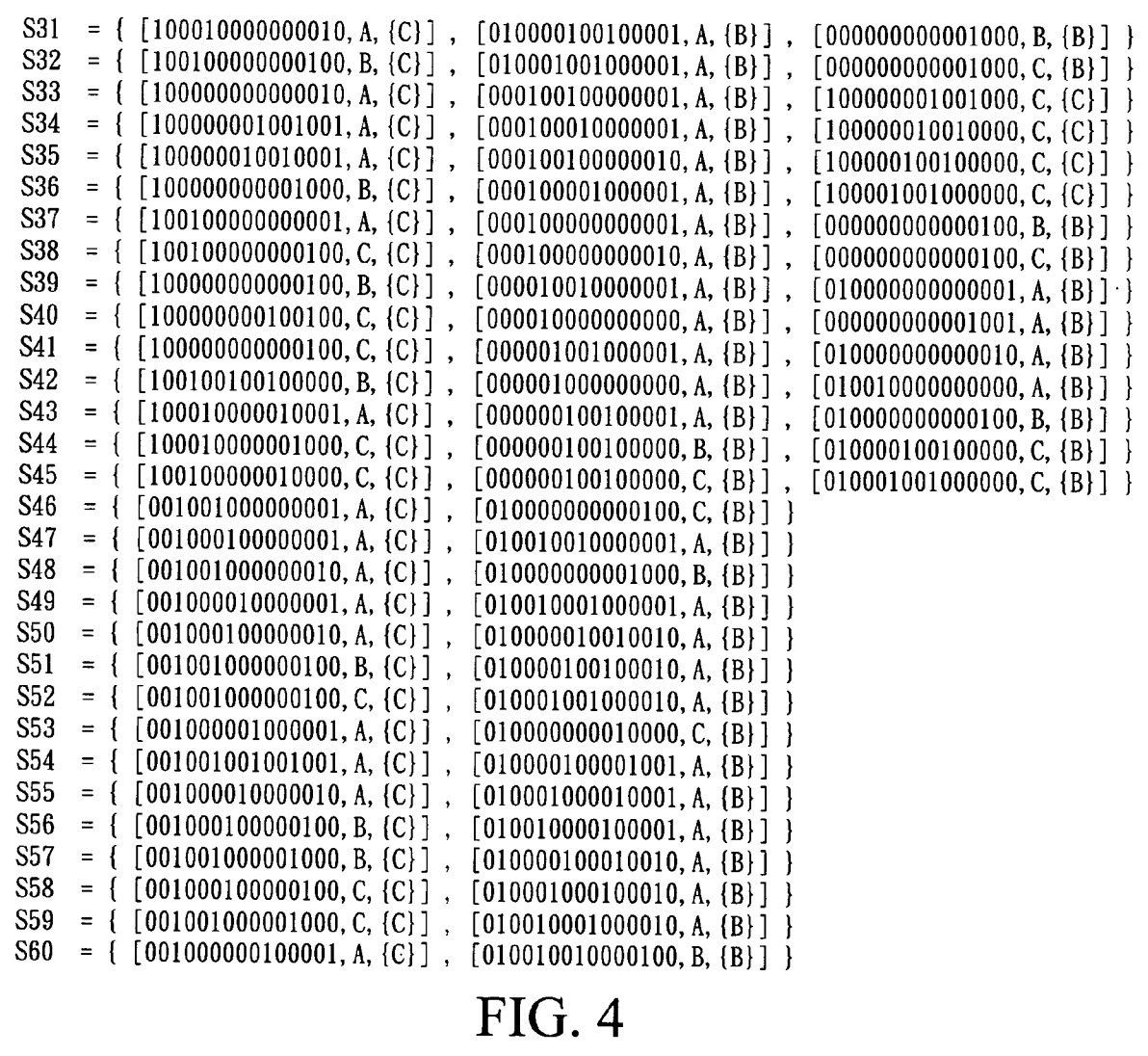
Figure 5:
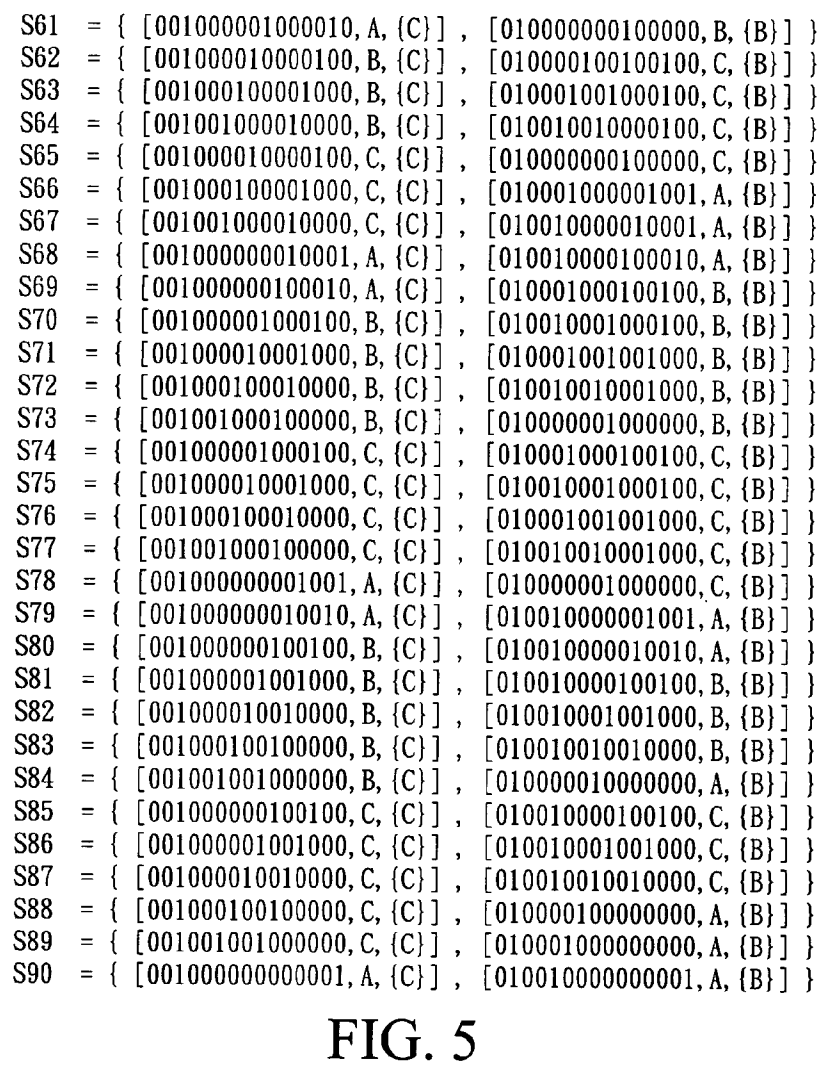
Figure 6:
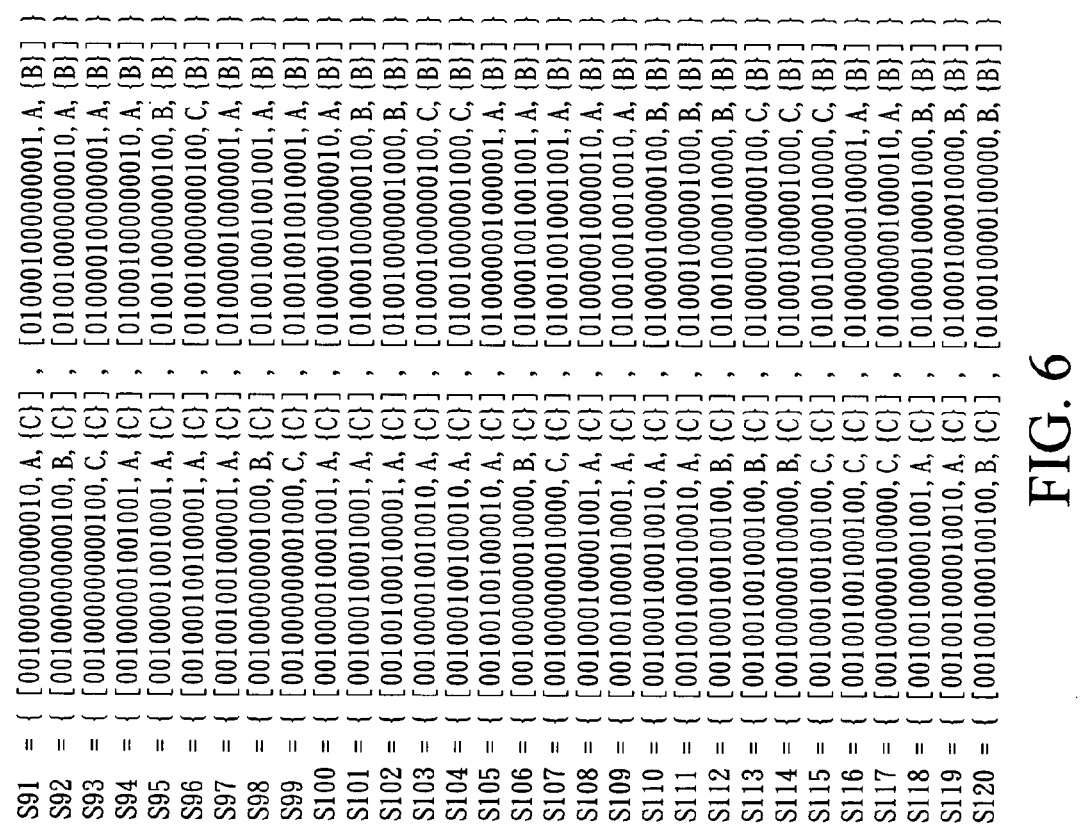
Figure 7:
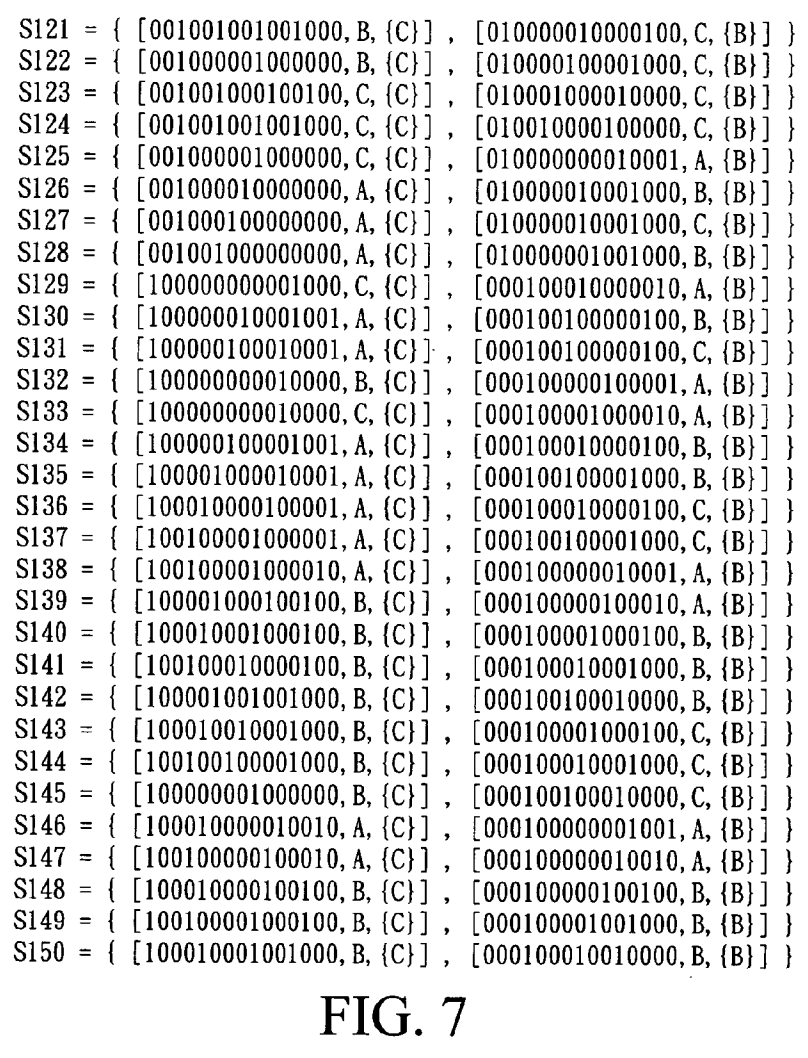
Figure 8:
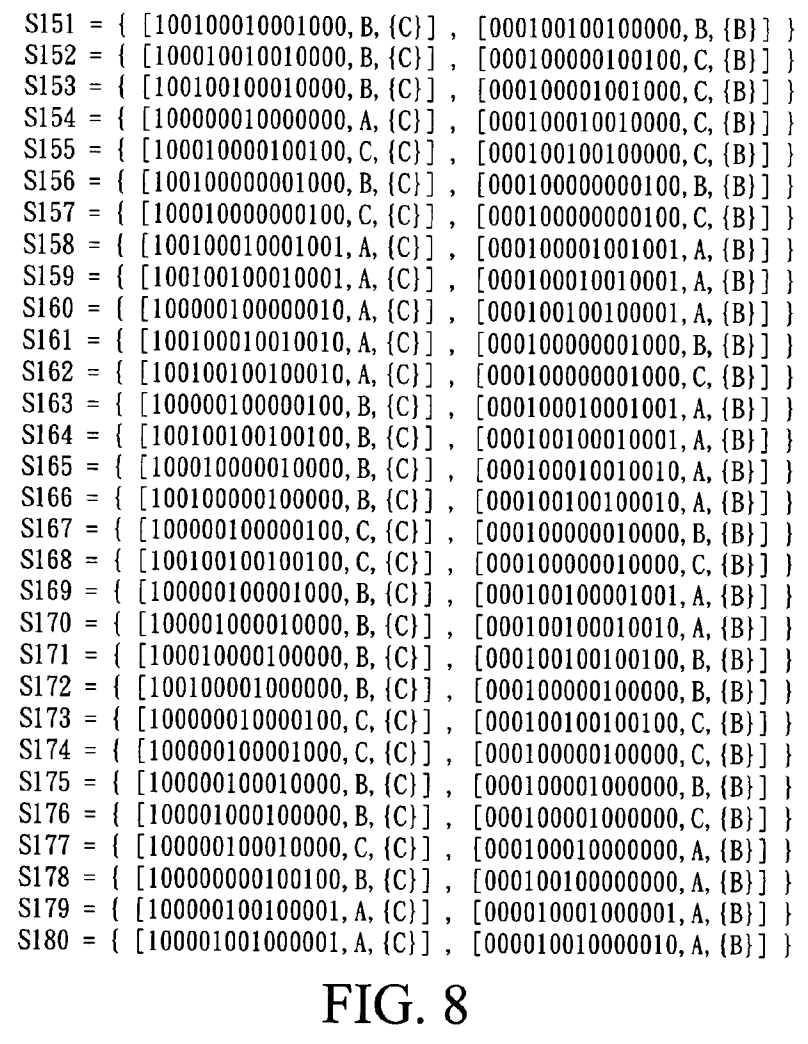
Figure 9:
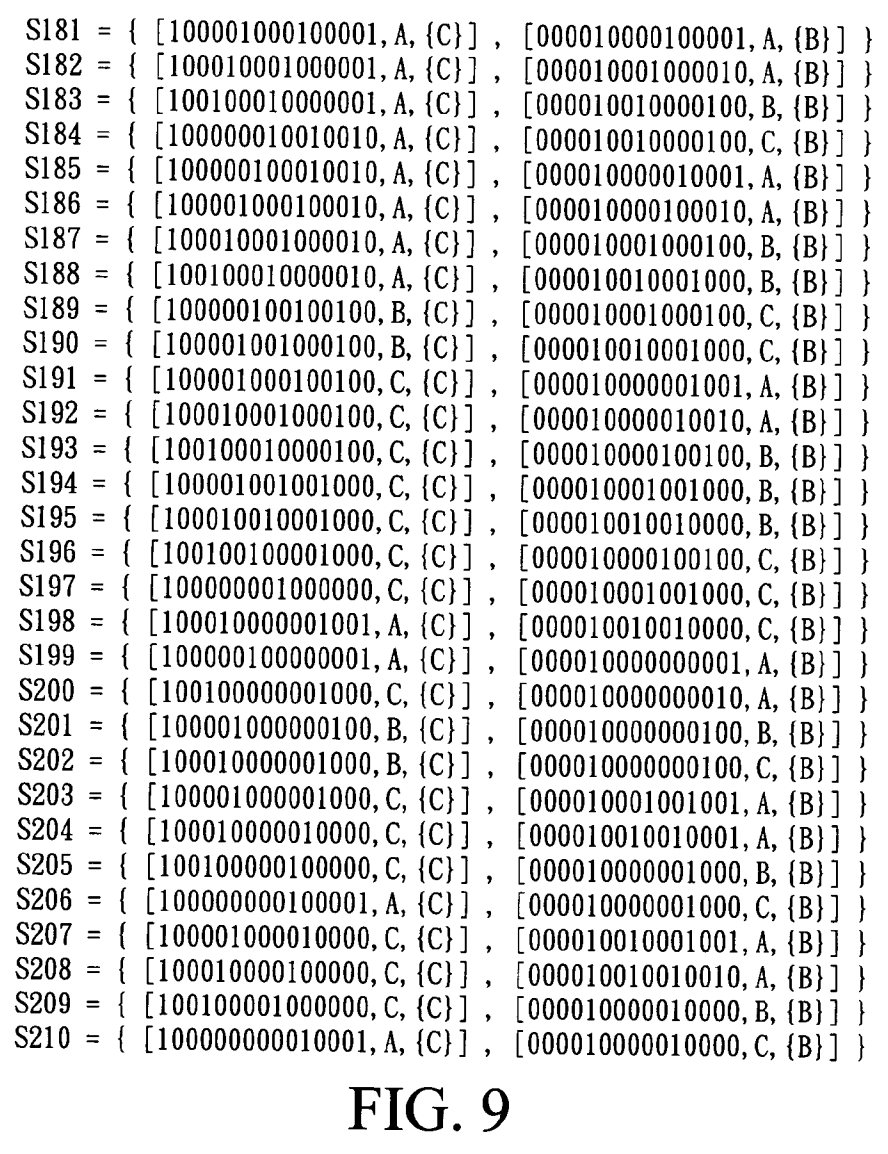
Figure 10:
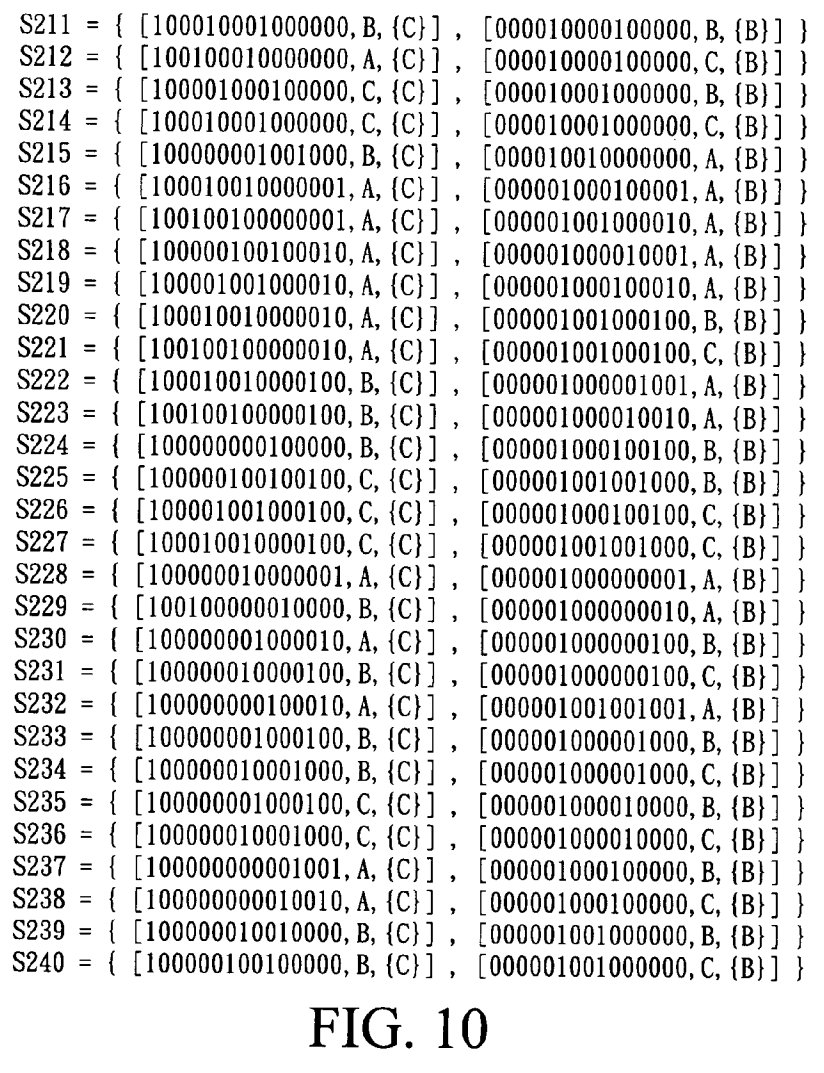
Figure 11:
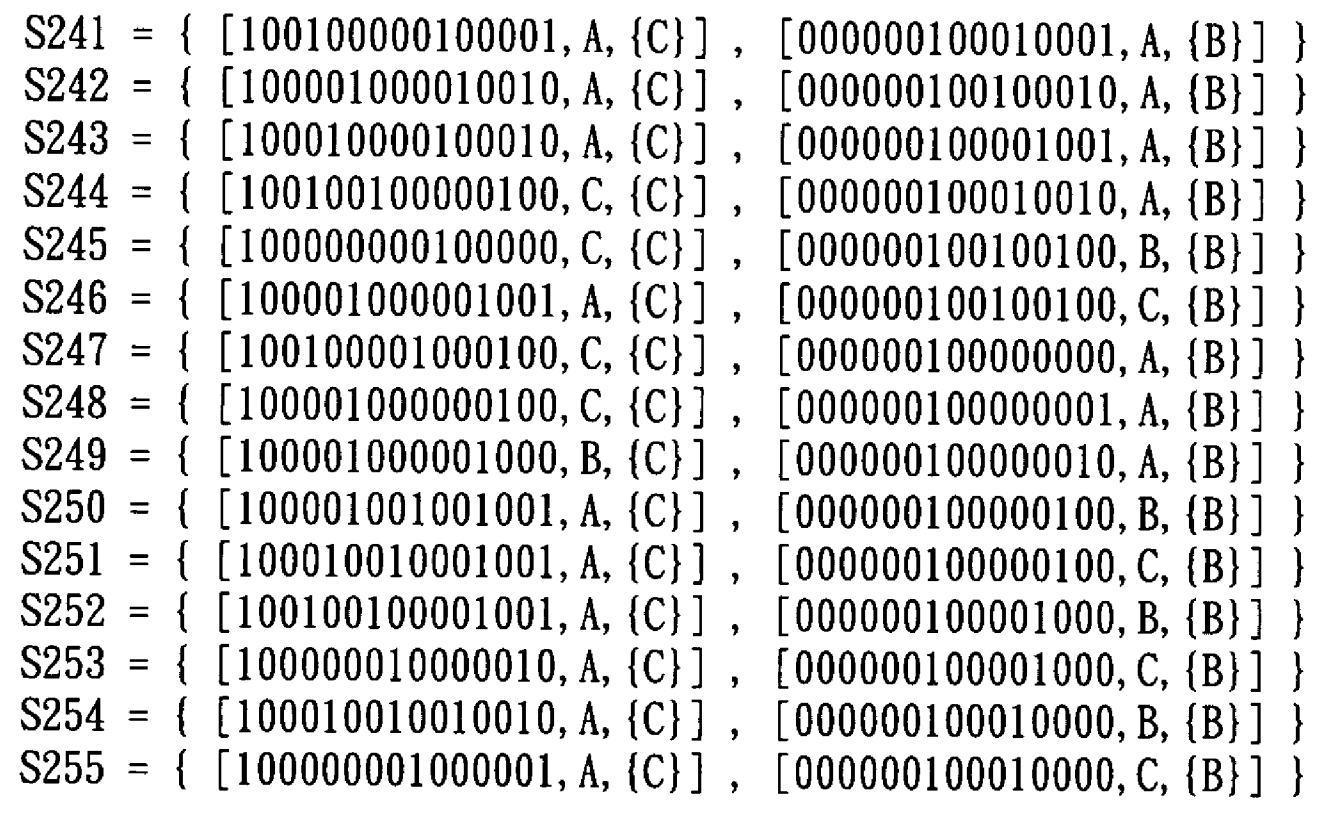

FIG. 1 shows the main procedure in the disclosed method. First, the data words are converted into the corresponding code words as usual (step 100). In this step, one basically searches a predetermined modulation table to look for the code word in a code word set corresponding to the data word (FIGS. 3 to 11 are schematic views of the modulation table in a preferred embodiment of the invention). Under the conditions of satisfying the type and (d, k) constraints, an optimal code word in the code word set is found for encoding. This part is well known prior art to people skilled in the field and therefore not explained herein. When starting, the disclosed method uses a counter to recording the number of data words that have been encoded. The counter value is added one after each encoding of a data word (step 110). This counter value is used to determine when to perform the procedure of inserting a type-control code word. Before executing the disclosed method, a predetermined interval is needed. So that the method can always check whether the counter value reaches the predetermined interval during the encoding procedure (step 120). For example, if the predetermined interval is 3, it means that each time a type-control code word insertion procedure has to be performed after the modulation of three data words (the length of each data word is one byte) is completed. In a preferred embodiment of the invention, the predetermined interval is 1. Actually, the value of the predetermined interval can be assigned by using predetermined interval rules too. In the interval rules, one can assign to use a fixed interval (i.e., the length of the interval is fixed, such as 7, 7, 7, 7 . . . ) or a variable interval (i.e., the length of the interval varies according to a certain rule, such as 7, 9, 7, 9 . . . ). When the predetermined interval is reached during the encoding procedure, one encoding procedure of inserting a type-control code word is then executed (step 130). If the predetermined interval is not reached yet, the procedure returns to step 100 to repeat its subsequent steps. The details of the encoding procedure of the type-control code word will further be described later. After the insertion of the type-control code word, the method resets the counter value to zero (step 140). It then determines whether the encoding procedure for all data words is completed (step 150). If not, the procedure goes back to step 100 to repeat steps 100 through 150. The procedure ends when the encoding procedure for all data words is finished.

Basically, to avoid over-reducing the coding rate, the length of the type-control code word should be not too long. It is usually can be selected from the type-control code word vector Vj in a predetermined type-control code word set Ti.

FIG. 2 shows three different type-control code word sets (T1, T2, and T3). These type-control code word sets (Ti) can be expressed as follows: T1={[type-control code word vector (Vj)], [type-control code word vector (Vj+1)], . . . }, where i>0.

Each type-control code word vector Vj is further expressed by: Vj=[type-control code word, type, type-forbidden set], where j>0.

Basically, aside from the fact that type-control code words have a limitation in length, the type-control code word vectors Vj also must further satisfy the following constraints:

(1) when the type-control code words of two type-control code word vectors Vj are the same, the types of these two type-control code word vectors must be different;

(2) when the type-control code words of two type-control code word vectors Vj are the same, the type-forbidden sets of these two type-control code word vectors must be the same;

(3) the type of the type-control code word vector Vj must belong to all types of type dependency modulation method;

(4) the type-forbidden set of the type-control code word vector Vj is a set consisted of at least one type.

In the following, we use a preferred embodiment to demonstrate the feasibility of the disclosed method.

Suppose the predetermined initial type of the whole encoding procedure is "A", and the predetermined interval is 1 (that is, the method will insert a type-control code word between two data words). The type-control code word for insertion has a length of 2 bits (i.e., the T2 type-control code word set in FIG. 2). And the two data words to be encoded are "57" and "96."

After searching the modulation tables in FIGS. 3 to 11, we obtain the set corresponding to the first data word "57" is:

S57={[001001000001000, B, {C}],
[010000100010010, A, {B}]}.

Since it has two code words and both of their type-forbidden sets do not contain the initial type "A," so any code word can be used for encoding. Here we select the first code word, "001001000001000," for encoding. As the predetermined interval is 1, one has to first perform the procedure of inserting a type-control code word before encoding the next data word. The T2 type-control code word set is:

T2={[00,A,{B}], [01,A,{C}], [10,A,{C}]}.

There are three type-control code word vectors, V1, V2 and V3. The type-forbidden sets are {B}, {C}, and {C}, respectively. Without violating the type-forbidden constraints, the type-control code word except for the one in the first type-control code word vector V1 can be used.

At this moment, the method finds the set corresponding to the next data word "96" as:

S96={[001000100100001,A,{C}],
[010010000000100,C,{B}]}.

It similarly has two code words and the forbidden types are {C} and {B}, neither of which is equal to "A." Therefore, they can be legally added after the aforementioned type-control code word to be inserted. As long as the (d, k) constraint is not violated, any legal encoding procedure is permitted. For example, when selecting the type-control code word in V2, only the first of the two code words for the data word "96" is legal. When selecting the type-control code word in V3, both of the two code words for the data word "96" are legal. In this case, an optimized selection can be made according to the predetermined DC component control ability.

For the current embodiment, one may choose the type-control code word in V2 and the first code word for the data word "96" as the final modulation elements. The final modulation result is then:

{001001000001000, 01, 001000100100001}.

Although the type dependency modulation method with type control of the invention slightly lowers the coding rate after inserting the type-control code words, the selectable code words are nonetheless increased. It achieves the DC component control ability close to other modulation methods in the prior art (such as the EFM and EFMPlus modulation).

During the procedure of converting code words back to the data words, the method only needs to record (1) actually code word sequence contents (including the inserted type-control code words) and (2) a predetermined interval (in order to know the positions of the inserted type-control code words).

This part is well known to people skilled in the field and, thus, will not be further described here.

Certain variations would be apparent to those skilled in the art, which variations are considered within the spirit and scope of the claimed invention.

What is claimed is:

1. A type dependency modulation method with type control that combines the concepts of code word type and code word set, and inserts type-control code words at a predetermined interval during an encoding procedure to increase an effect of DC component control, the method comprising the steps of:
    (a) executing said encoding procedure to find a code word corresponding to a data word;
    (b) executing a counter accumulation procedure using a counter to accumulate a counter value until the counter value reaches said predetermined interval; and
    (c) when reaching the predetermined interval, executing the steps of:
        inserting said type-control code word for determining next code word to be connected, wherein the type-control code word is selected from a type-control code word vector Vj in a type-control code word set Ti, where i>0 and j>0; and
        resetting the counter value to zero after inserting said type-control code word, wherein steps (a) through (c) are repeated until all the data word are encoded.

2. The method of claim 1, wherein said predetermined interval is 7 bytes; namely, the length of 7 data words.

3. The method of claim 1, wherein said predetermined interval is assigned according to an interval rule.

4. The method of claim 3, wherein the interval rule includes intervals of fixed or variable lengths.

5. The method of claim 1, wherein the type-control code word is less than 3 bits.

6. The method of claim 1, wherein the type-control code word set is expressed as:

$Ti=\{[\text{type-control code word vector }(Vj)], [\text{type-control code word vector }(Vj+1)], \ldots \}$, where $i>0$ and $j>0$.

7. The method of claim 1, wherein the type-control code word vector is expressed as:

$Vj=[\text{type-control code word, type, type-forbidden set}]$, where $j>0$.

8. The method of claim 7, wherein the types of same type-control code word in the type-control code word vector Vj are different.

9. The method of claim 7, wherein the type-forbidden sets of same type-control code word in the type-control code word vector Vj are the same.

10. The method of claim 7, wherein the type of the type-control code word vector Vj belongs to the all types of said type dependency modulation method.

11. The method of claim 7, wherein the type-forbidden set of the type-control code word vector Vj is a set consisted of at least one type.

12. The method of claim 1, wherein the step of inserting said type-control code word produces a modulation result satisfying the predetermined (d, k) constraint of said type dependency modulation method.

13. The method of claim 1, wherein the step of inserting said type-control code word produces a modulation result satisfying a predetermined type dependency rule of said type dependency modulation method.

* * * * *